(12) United States Patent
Buckley, Jr.

(10) Patent No.: US 7,231,571 B2
(45) Date of Patent: Jun. 12, 2007

(54) SINGLE-PASS METHODS FOR GENERATING TEST PATTERNS FOR SEQUENTIAL CIRCUITS

(75) Inventor: Delmas R. Buckley, Jr., Livermore, CA (US)

(73) Assignee: Yardstick Research, L.L.C., Livermore, CA (US)

( * ) Notice: Subject to any disclaimer, the term of this patent is extended or adjusted under 35 U.S.C. 154(b) by 48 days.

(21) Appl. No.: 10/908,146

(22) Filed: Apr. 28, 2005

(65) Prior Publication Data

US 2005/0166114 A1     Jul. 28, 2005

(51) Int. Cl.
*G01R 31/28* (2006.01)

(52) U.S. Cl. .................. 714/738; 714/724; 714/25; 714/32

(58) Field of Classification Search .......... None
See application file for complete search history.

(56) References Cited

U.S. PATENT DOCUMENTS

| | | | | |
|---|---|---|---|---|
| 5,377,197 A | * | 12/1994 | Patel et al. ............... | 714/724 |
| 5,430,736 A | * | 7/1995 | Takeoka et al. ........... | 714/726 |
| 5,502,729 A | * | 3/1996 | Nakata .................... | 714/728 |
| 5,588,008 A | * | 12/1996 | Nakata .................... | 714/728 |
| 5,590,135 A | * | 12/1996 | Abramovici et al. ...... | 714/724 |
| 5,831,996 A | | 11/1998 | Abramovici et al. | |
| 5,910,958 A | * | 6/1999 | Jay et al. ................. | 714/738 |
| 5,933,633 A | | 8/1999 | Good et al. | |
| 6,018,813 A | | 1/2000 | Chakradhar et al. | |
| 6,141,630 A | | 10/2000 | McNamara et al. | |
| 6,195,776 B1 | | 2/2001 | Ruiz et al. | |
| 6,209,120 B1 | | 3/2001 | Kurshan et al. | |
| 6,282,681 B1 | | 8/2001 | Sun et al. | |
| 6,292,915 B1 | | 9/2001 | Hosokawa et al. | |
| 6,449,743 B1 | * | 9/2002 | Hosokawa ................ | 714/738 |
| 6,789,222 B2 | * | 9/2004 | Buckley, Jr. ............. | 714/738 |
| 7,017,096 B2 | * | 3/2006 | Abramovici et al. ...... | 714/738 |

OTHER PUBLICATIONS

Bergmann, J.P. etal., "Improving Coverage Analysis and Test Generation for Large Circuits," IEEE 1999.
Bertacco, V., "Achieving Scalable Hardware Verification with Symbolic Simulation," Ph.D. Dissertation, Stanford Univ., Aug. 2003, Ch. 3, pp. 43-66.
Bhatia, S. etal., "Integration of Hierarchical Test Generation with Behavioral Synthesis of Controller and Data Path Circuits," IEEE Trans. VLSI Sys., vol. 6, No. 4, Dec. 1998.

(Continued)

*Primary Examiner*—Albert Decady
*Assistant Examiner*—John Trimmings
(74) *Attorney, Agent, or Firm*—Robert Buckley

(57) ABSTRACT

A single-pass method for generating test patterns for sequential circuits operates upon an iterative array of time-frames representing the circuit. A mapping function is inserted at the end of each time-frame. Fault objects arriving at circuit next-state lines are mapped into good next-state fault objects and are placed onto corresponding present-state lines for a next time-frame. The good next-state mapping permits fault-propagation and path-enabling function size to be bounded by a size established during an initial time-frame. Path-enabling functions created during the initial time-frame are saved and are reused during subsequent time-frames. A search for test patterns continues from one time-frame to a next until a valid test pattern is found for each detectable fault.

21 Claims, 18 Drawing Sheets

OTHER PUBLICATIONS

Brace, K.S. etal., "Efficient Implementation of a BDD Package," 27th ACM/IEEE Des. Auto. Conf., 1990, pp. 40-45.

Bryant, R.E., "Graph-Based Algorithms for Boolean Function Manipulation," IEEE Trans. Comp., vol. C-35, No. 8, Aug. 1986, pp. 677-691.

Bryant, R.E., "Symbolic Boolean Manipulation with Ordered Binary-Decision Diagrams," ACM Comp. Surveys, vol. 24, No. 3, Sep. 1992, pp. 292-318.

Chakravarty, S. etal., "Simulation and Generation of IDDQ Tests for Bridging Faults in Combinational Circuits," IEEE Trans. Comp., vol. 45, No. 10, Oct. 1996, pp. 1131-1140.

Chang, S-C. etal., "TAIR: Testability Analysis by Implication Reasoning," IEEE Trans. Comp-Aided Des., vol. 19, No. 1, Jan. 2000, pp. 152-160.

Cheng, K-T., "Tutorial and Survey Paper: Gate-Level Test Generation for Sequential Circuits," ACM Trans. Des. Auto. of Elec. Sys., vol. 1, No. 4, Oct. 1996, pp. 405-442.

Cheng, K-T., "Transition Fault Testing for Sequential Circuits," IEEE Trans. Comp-Aided Des., vol. 12, No. 12, Dec. 1993, pp. 1971-1983.

Cheng, K-T. etal., "Generation of High Quality Tests for Robustly Untestable Path Delay Faults," IEEE Trans. Comp., vol. 45, No. 12, Dec. 1996, pp. 1379-1392.

Cheng, K-T. etal., "Automatic Generation of Functional Vectors Using the Extended Finite State Machine Model," ACM Trans. Des. Auto., vol. 1, No. 1, Jan. 1996, pp. 57-79.

Cheng, K-T. etal., "A Functional Fault Model for Sequential Machines," IEEE Trans. Comp-Aided Des., vol. 11, No. 9, Sep. 1992, pp. 1065-1073.

Corno, F. etal., "Enhancing Topological ATPG with High-Level Information and Symbolic Techniques," Int'l Conf. Comp. Des. 1998.

Das, D.K. etal., "Isomorph-Redundancy in Sequential Circuits," IEEE Trans. Comp., vol. 49, No. 9, Sep. 2000, pp. 992-997.

Fujiwara, H., "A New Class of Sequential Circuits with Combinational Test Generation Complexity," IEEE Trans. Comp., vol. 49, No. 9, Sep. 2000, pp. 895-905.

Fummi, F. etal., "A Hierarchical Test Generation Approach for Large Controllers," IEEE Trans. Comp., vol. 49, No. 4, Apr. 2000, pp. 289-302.

Ghosh, I. etal., "Automatic Test Pattern Generation for Functional RTL Circuits Using Assignment Decision Diagrams," Des. Auto. Conf. 2000.

Giraldi, J. etal., "EST: The New Frontier in Automatic Test-Pattern Generation," 27th ACM/IEEE Des. Auto. Conf. 1990, pp. 667-672.

Hamzaoglu, I. etal., "Deterministic Test Pattern Generation Techniques for Sequential Circuits," IEEE/ACM Int'l Conf. on CAD, 2000, pp. 538-543.

Hamzaoglu, I., etal, "New Techniques for Deterministic Test Pattern Generation," Jour. Elec. Testing, vol. 15, Issue 1-2, Aug.-Oct. 1999, pp. 63-73.

Hsiao, M.S., etal, "Dynamic State Traversal for Sequential Circuit Test Generation," ACM Trans. Des. Auto. of Elec. Sys., vol. 5, No. 3, Jul. 2000, pp. 548-565.

Hsu, Y-C., etal, "A Simulator for At-Speed Robust Testing of Path Delay Faults in Combinational Circuits," IEEE Trans. Comp., vol. 45, No. 11, Nov. 1996, pp. 1312-1388.

Inoue, T., etal, "An Optimal Time Expansion Model Based on Combinational ATPG for RT Level Circuits," Proc. 7th Asian Test Symp, Dec. 1998, pp. 190-197.

Inoue, T., etal, "Test Generation for Acyclic Sequential Circuits with Hold Registers," Proc. Int'l Conf on CAD, 2000, pp. 550-556.

IP, C.N., "Simulation Coverage Enhancement Using Test Stimulus Transformation," Proc. Int'l Conf on CAD, 2000, pp. 127-134.

Kocan, F., etal, "Concurrent D-Algorithm on Reconfigurable Hardware," Proc. Int'l Conf on CAD, 1999, pp. 152-156.

Langevin, M., etal, "Behavioral Verification of an ATM Switch Fabric Using Implicit Abstract State Enumeration," Proc. 1996 Int'l Conf Comp Des, pp. 20-26.

Lin, X., etal, "Techniques for Improving the Efficiency of Sequential Circuit Test Generation," Proc. 1999 Int'l Conf CAD, pp. 147-151.

Lin, X., etal, "On Finding Undetectable and Redundant Fautls in Synchronous Sequential Circuits," 1998 Int'l Conf Comp Des.

Moundanos, D., etal, "Abstraction Techniques for Validation Coverage Analysis and Test Generation," IEEE Trans. Comp., vol. 47, No. 1, Jan. 1998, pp. 2-14.

Ochi, H., etal, "Breadth-First Manipulation of Very Large Binary-Decision Diagrams," Proc. Int'l Conf CAD, Nov. 1993, pp. 48-55.

Pomeranz, I., etal, "Test Generation for Synchronous Sequential Circuits to Reduce Storage Requirements," 7th Asian Test Symp, Dec. 1998, pp. 446-451.

Pomeranz, I., etal, "A Diagnostic Test Generation Procedure for Combinational Circuits Based on Test Elimination," 7th Asian Test Symp, Dec. 1998, pp. 486-491.

Psarakis, M., etal, "Sequential Fault Modeling and Test Pattern Generation for CMOS Iterative Logic Arrays," IEEE Trans. Comp., vol. 49, No. 10, Oct. 2000, pp. 1083-1099.

Stephan, P., etal, "Combinational Test Generation Using Satisfiability," IEEE Trans. CAD, vol. 15, No. 9, Sep. 1996, pp. 1167-1176.

Sun, X., etal, "Functional Verification Coverage vs. Physical Stuck-at Fault Coverage," 1198 Int'l.Symp Defect Fault Tol VLSI, pp. 108-116.

Tafertshofer, P., etal, "SAT Based ATPG Using Fast Justification and Propagation in the Implication Graph," 1999 Int'l Conf CAD, pp. 139-146.

Tekumalla, R.C., etal, "On Primitive Fault Test Generation in Non-Scan Sequential Circuits," 1998 Int'l Conf CAD, pp. 275-282.

Tragoudas, S., etal, "ATPG Tools for Delay Faults at the Functional Level," ACM Trans. Des. Auto. Elec. Sys., vol. 7, No. 1, Jan. 2002, pp. 33-57.

Van Der Linden, J.T. etal., "Complete Search In Test Generation for Industrial Circuits with Improved Bus-Conflict Detection," 7th Asian Test Symp., Dec. 1998, pp. 212-221.

Williams, T.W., "The New Frontier for Testing: Nano Meter Technologies," 7th Asian Test Symp., Dec. 1998, pp. 2-7.

Raik, J. etal., "Sequential Circuit Test Generation Using Decision Diagram Models," Proc. Des. Auto. Test Europe, 1999, pp. 736-740.

Rudnick, E.M. etal., "Fast Sequential Circuit Test Generation Using High-Level and Gate-Level Techniques," Proc. Des. Auto. Test Europe, 1998, pp. 570-576.

* cited by examiner

```
fault-decomposition phase {                                                    8-1
  for each NS line {
    for each fault-name {
      for each label {
        decompose fault-propagation-function into individual S/I's;            8-5
          for each resulting S/I {
            if (exists record having: fault-name, TF(1)I-part,
                   current-label, current-S, current-I)
                  set the record's appropriate NS line flag;
            else {                                                             8-10
               create a record having form
                      <fault-name, TF(1)I-part, current-label,
                       current-S, current-I, good-next-state,
                       NS line flags, new-label, and posted flag>;
               set the new record's: fault-name, TF(1)I-part, current-label,   8-15
                       current-S, and current-I fields;
               determine the good-next-state;
               set the new record's good-next-state field;
               set the new record's appropriate NS line flag;
            }                                                                  8-20
          }
        }
      }
    }
  }                                                                            8-25
}
```

FIG. - 8

```
purge-posting phase {                                                          9-1
  while (exists a record having a blank new-label field) {
    select a record having a blank new-label field;
    obtain the selected record's: fault-name, TF(1)I-part,
          good-next-state, and NS flags;                                        9-5
          // let these elements define a "pattern"
    select all records having the same pattern and a non-blank
          new-label field;
    if (exists a record having pattern, a non-blank new-label
          field, and a blank posted flag field) {                               9-10
      select all records having pattern and blank new-label field;
      eliminate those records;
          // the pattern has been explored previously
    }
    else {                                                                     9-15
      select all records having pattern and blank new-label field;
      get a new label;
      for each selected record {
        set the new-label field to the value of the new label;
      }                                                                        9-20
      create new search object: <fault-name, new label,
                                good-next-state, I-dontcare>;
      place new search object onto the PS lines corresponding to the NS flags;
      create a replacement-local-fault:
          < fault-name, new label, good-next-state, TF(1)I-part>;               9-25
      append the replacement-local-fault to previously created replacement-
          local-faults that share the same fault-name;
    }
  }
  select all records having a blank posted flag field;                          9-30
  set the posted flag in all the selected records;
}
```

FIG. - 9

```
extract-test-patterns process {                                                          10-1
    for each primary output line {
        for each fault-name {
            for each label {
                // <fault-name, label, fault-propagation-function>                       10-5
                decompose the fault-propagation-function into an S-part, and
                    all its I-parts;
                // find all immediately preceding records
                //
                for each I-part {                                                        10-10
                    select all database records having <fault-name, label> in the
                            fault-name and new-label fields;
                    // these are all the records that mapped to the new label
                    if (exists at least one such record) {
                        for each selected record {                                       10-15
                            get the contents of the current-I field;
                            // this is one record that mapped to the new label
                            if (exists an object having <fault-name, good-next-state,
                                    output-line-name, output-level, at least one I-part>)
                                // if a test sequence is currently being constructed     10-20
                                    append the contents of the current-I field to the
                                        right-hand end of the object;
                            )
                            else {
                                /* but if no test sequence is yet being constructed,     10-25
                                    begin construction: need a fault-name, a current-S,
                                    a current-I, use the current-S and current-I to
                                    construct a good next-state, get the output-line-name,
                                    use the current-S, current-I, and the output-line
                                    1-set to determine an output-level, assemble the     10-30
                                    parts into a partial test sequence: <fault-name,
                                    good-next-state, output-line-name, output-level,
                                    current-I> */
                            }
                        }                                                                10-35
                        else {
                            // you are currently at the initial time-frame
                            if (exists an object having <fault-name, good-next-state,
                                    output-line-name, output-level, at least one I-part>) {
                                // if a test sequence is currently being constructed     10-40
                                append the contents of the current-I field to the
                                        right-hand end of the object;
                                append the contents of the current-S field to the
                                        right-hand end of the object;
                            }                                                            10-45
                            else {
                                /* but if no test sequence is yet being constructed,
                                    begin construction: need a fault-name, a current-S,
                                    a current-I, use the current-S and current-I to
                                    construct a good next-state, get the output-line-name, 10-50
                                    use it and the current-S and current-I to determine
                                    an output-level, assemble the parts into a partial
                                    test sequence: <fault-name, good-next-state, output-
                                    line-name, output-level, current-I> */
                            }                                                            10-55
                        }
                    }
                }
            }
        }                                                                                10-60
    }
}
```

FIG. - 10

```
Validate extracted test sequence process {                          11-1
  for each fault having an extracted test sequence {
    create faulty 1-sets commencing with the faulty net;
    save the faulty 1-sets for the next-state lines \
      and for the primary output lines;                             11-5
    for each extracted test sequence for a given fault {
      apply the extracted test sequence to the faulty next-state \
        1-sets to derive a faulty state sequence;
      concatenate the final state of the faulty state sequence \
        and the final input vector of the extracted test sequence;  11-10
      apply the concatenation to the faulty primary output line \
        1-sets to determine output levels for a faulty output vector;
      compare the faulty output vector with the extracted test \
        sequence output vector;
      if the vectors are not equal, the extracted \                 11-15
        test sequence is valid;
      else, the extracted test sequence is invalid;
    }
  }
}                                                                   11-20
```

FIG. - 11

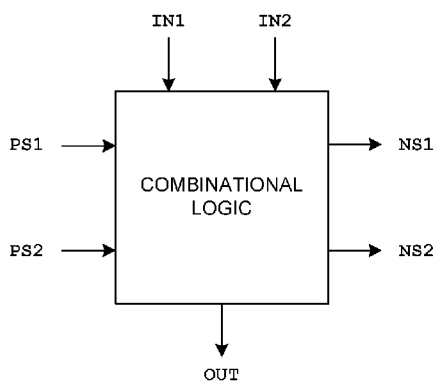

FIG. - 12

```
Primary input lines
IN1, IN2

Present-state lines
PS1, PS2

Primary output line
OUT = S1.I2

Next-state lines
NS1 = S1I3 + S2I1
NS2 = S0I1 + S1NI3 + S2I0

S0 = /PS1./PS2
S1 = /PS1.PS2
S2 = PS1./PS2

I0 = /IN1./IN2
I1 = /IN1.IN2
I2 = IN1./IN2
I3 = IN1.IN2

S0I1 = S0.I1
S1I2 = S1.I2
S1I3 = S1.I3
S1NI3 = S1./I3
S2I0 = S2.I0
S2I1 = S2.I1

Inverters
/IN1, /IN2, /PS1, /PS2, /I3
```

END OF Time-Frame[1]

```
Line NS1: fault-name: S2I1/0
          label: 0
          fault-propagation function: S2.I1 fault-name: S1I3/0
          label: 0
          fault-propagation function: S1.I3

Line NS2: no faults present
```

FIG. - 16

RECORD TABLE created during fault-decomposition phase of an Inter-Time-Frame-Process following Time-Frame[1]

```
record format: < fault-name, TF[1]I-part, current-label,
                 current-S, current-I, good-next-state,
                 NS line flags, new-label, posted flag >

Time-Frame[1]

record #1: < S2I1/0, I1, 0, S2, I1, S2, (T,F), _, _ > record #2: < S1I3/0, I3, 0, S1, I3, S2, (T,F), _, _ >
```

FIG. - 17

RECORD TABLE entries completed during purge-posting phase of the Inter-Time-Frame-Process following Time-Frame[1]

```
record format: < fault-name, TF[1]I-part, current-label,
                 current-S, current-I, good-next-state,
                 NS line flags, new-label, posted flag >

Time-Frame[1]

record #1: < S2I1/0, I1, 0, S2, I1, S2, (T,F), 1, T > record #2: < S1I3/0, I3, 0, S1, I3, S2, (T,F), 1, T >
```

FIG. - 18

```
New Search Objects created during purge-posting phase of
   the Inter-Time-Frame-Process following Time-Frame[1]

New Search Objects for Time-Frame[2]

format: < fault-name, new-label,
         good-next-state, I-dontcare >

PS1 for Time-Frame[2]:  < S2I1/0, 1, S2, I-dontcare >
                        < S1I3/0, 1, S2, I-dontcare >

PS2 for Time-Frame[2]: blank

Replacement Local Faults for Time-Frame[2]

format: < fault-name, new-label, good-next-state,
         TF[1]I-part >

For use at net S2I1: < S2I1/0, 1, S2, I1 >
For use at net S1I3: < S1I3/0, 1, S2, I3 >
```

FIG. - 19

```
              END OF Time-Frame[2]

Line NS1: fault-name: S2I1/0
          label: 1
          fault-propagation function: S2.I1 fault-name: S1I3/0
          label: 1
          fault-propagation function: S2.I1, S2.I3

Line NS2: fault-name: S2I1/0
          label: 1
          fault-propagation function: S2.I0, S2.I1 fault-name: S1I3/0
          label: 1
          fault-propagation function: S2.I0, S2.I1
```

FIG. - 20

```
RECORD TABLE updated during the Inter-Time-Frame-Process
     following Time-Frame[2]

record format: < fault-name, TF[1]I-part, current-label,
                current-S, current-I, good-next-state,
                NS line flags, new-label, posted flag >

Time-Frame[1]

record #1: < S2I1/0, I1, 0, S2, I1, S2, (T,F), 1, T > record #2: < S1I3/0, I3, 0, S1, I3, S2, (T,F), 1, T >

Time-Frame[2]

record #3: < S2I1/0, I1, 1, S2, I0, S1, (F,T), 2, T > record #4: < S2I1/0, I1, 1, S2, I1, S2, (T,T), 3, T > record #5: < S1I3/0, I3, 1, S2, I3, S0, (T,F), 2, T > record #6: < S1I3/0, I3, 1, S2, I1, S2, (T,T), 3, T > record #7: < S1I3/0, I3, 1, S2, I0, S1, (F,T), 4, T >
```

FIG. - 21

New Search Objects created during purge-posting phase of
the Inter-Time-Frame-Process following Time-Frame[2]

New Search Objects for Time-Frame[3]

PS1 for Time-Frame[2]:  < S2I1/0, 3, S2, I-dontcare >
                        < S1I3/0, 2, S0, I-dontcare >
                        < S1I3/0, 3, S2, I-dontcare >

PS2 for Time-Frame[2]:  < S2I1/0, 2, S1, I-dontcare >
                        < S2I1/0, 3, S2, I-dontcare >
                        < S1I3/0, 3, S2, I-dontcare >
                        < S1I3/0, 4, S1, I-dontcare >

Replacement Local Faults for Time-Frame[3]

For use with net S2I1:  < S2I1/0, 2, S1, I1 >
                        < S2I1/0, 3, S2, I1 >

For use with net S1I3:  < S1I3/0, 2, S0, I3 >
                        < S1I3/0, 3, S2, I3 >
                        < S1I3/0, 4, S1, I3 >

FIG. - 22

END OF Time-Frame[3]

Line NS1: no faults present

Line NS2: no faults present

Line OUT: fault-name: S2I1/0
          label: 2
          fault-propagation function: S1.I2 fault-name: S2I1/0
          label: 3
          fault-propagation function: S2.I2 fault-name: S1I3/0
          label: 3
          fault-propagation function: S2.I2 fault-name: S1I3/0
          label: 4
          fault-propagation function: S1.I2

FIG. - 23

EXTRACTING TEST SEQUENCES from RECORD TABLE and primary
output line OUT following END of Time-Frame[3]

Line OUT: < S2I1/0, 2, S1, I2 > record #3: < S2I1/0, I1, 1, S2, I0, S1, (F,T), 2, T > record #1: < S2I1/0, I1, 0, S2, I1, S2, (T,F), 1, T >

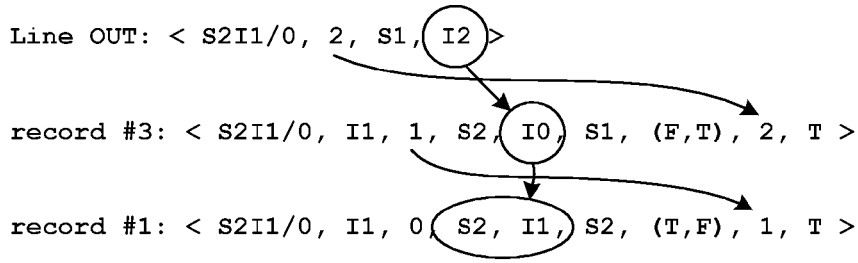

A test sequence for S2I1/0: S2,I1,I0,I2
A final good-next-state for the sequence: S1
1-set for OUT: S1.I2
A final OUT level for good copy of circuit: 1

A second test sequence for S1I2/0

Line OUT: < S2I1/0, 3, S2, I2 >
record #4: < S2I1/0, I1, 1, S2, I1, S2, (T,T), 3, T >
record #1: < S2I1/0, I1, 0, S2, I1, S2, (T,F), 1, T >
Test sequence: S2,I1,I1,I2
Final good-next-state: S0
Final OUT level: 0

Test sequences for S1I3/0

Sequence #1 (label 3): S1,I3,I1,I2
Final good-next-state: S0
Final OUT level: 0

Sequence #2 (label 4): S1,I3,I0,I2
Final good-next-state: S1
Final OUT level: 1

FIG. -24

```
                    VALIDATION OF EXTRACTED TEST SEQUENCES

FAULT:  S2I1/0

FAULTY 1-SETS
          NS1-1: S1.I3
          NS2-1: S0.I1, S1(I0+I1+I2), S2.I0
          OUT-1: S1.I2

EXTRACTED TEST SEQUENCES

#1     Good State Sequence       S2.I1 -> S2, S2.I0 -> S1, S1.I2 : OUT-1 = 1
           Faulty State Sequence     S2.I1 -> S0, S0.I0 -> S0, S0.I2 : OUT-1 = 0

OUTPUT LEVELS DIFFER, THEREFORE EXTRACTED TEST SEQUENCE #1 IS VALID.

#2     Good State Sequence       S2.I1 -> S2, S2.I1 -> S2, S2.I2 : OUT-1 = 0
           Faulty State Sequence     S2.I1 -> S0, S0.I1 -> S1, S1.I2 : OUT-1 = 1

OUTPUT LEVELS DIFFER, THEREFORE EXTRACTED TEST SEQUENCE #2 IS VALID.

FAULT:  S1I3/0

FAULTY 1-SETS
          NS1-1: S2.I1
          NS2-1: S0.I1, S1(I1+I2+I3), S2.I0
          OUT-1: S1.I2

EXTRACTED TEST SEQUENCES

#1     Good State Sequence       S1.I3 -> S2, S2.I1 -> S2, S2.I2 : OUT-1 = 0
           Faulty State Sequence     S1.I3 -> S0, S0.I1 -> S1, S1.I2 : OUT-1 = 1

OUTPUT LEVELS DIFFER, THEREFORE EXTRACTED TEST SEQUENCE #1 IS VALID.

#2     Good State Sequence       S1.I3 -> S2, S2.I0 -> S1, S1.I2 : OUT-1 = 1
           Faulty State Sequence     S1.I3 -> S0, S0.I0 -> S0, S0.I2 : OUT-1 = 0

OUTPUT LEVELS DIFFER, THEREFORE EXTRACTED TEST SEQUENCE #2 IS VALID.
```

FIG. - 25

SINGLE-PASS METHODS FOR GENERATING TEST PATTERNS FOR SEQUENTIAL CIRCUITS

REFERENCE TO RELATED APPLICATION

This patent application is related to, and incorporates by reference the full disclosure of U.S. Pat. No. 6,789,222, entitled "Single-Pass Methods for Generating Test Patterns for Combinational Circuits."

FIELD OF THE INVENTION

The invention relates generally to electrical computers and digital processing systems, and more particularly to test pattern generators (class 714, subclass 738).

BACKGROUND ART

U.S. Pat. No. 6,789,222 teaches complete test pattern generation methods for combinational circuits. The methods find all test patterns for all detectable faults for a combinational circuit. This result is accomplished during a single pass through a circuit-level sorted description of a combinational circuit (e.g., a netlist). The methods implement an incremental, breadth-first process that attempts to activate and to propagate faults through the circuit. Faults reaching circuit primary output lines define test patterns.

A sequential circuit can be represented as a combinational part and a separate feedback storage part (prior art FIG. 1). The circuit can be analyzed as an iterative array of the combinational parts, each containing a copy of the fault (prior art FIG. 2; see for example, K-T Cheng, "Tutorial and Survey Paper: Gate-Level Test Generation for Sequential Circuits," ACM Trans. Design Automation of Electronic Sys., Vol. 1, No. 4, Oct. 1996, Pages 405-442).

The teachings of U.S. Pat. No. 6,789,222 can be applied to such an iterative array for generating test pattern sequences for sequentially detectable faults.

One way to do this is to create an array having a desired number of time-frames and to treat the array as a single, deep, combinational circuit. Use a data structure for path-enabling and for fault-propagation functions that is large enough to accommodate the single, deep, combinational circuit. The data structure size must represent a present-state and include one input vector for each time-frame of the array. Perform combinational test pattern generation on the single, deep, combinational circuit. Solving the problem this way, however, is impractical and limits the usefulness of the solution to very small sequential circuits and, at most, a few time-frames.

Another way to accomplish the desired result is to permit the data structures representing path-enabling and fault-propagation functions to begin at a size sufficient to handle a first time-frame. Then increase the data structure size to accommodate one additional input vector per additional time-frame. This solution, though complicated, permits slightly larger circuits or a few more time-frames to be handled. However, the function size grows rapidly and limits the size of the circuit and the number of time-frames. This approach too is impractical.

What is needed is a deterministic test pattern generator for sequential circuits that finds test pattern sequences for sequentially detectable faults during a single pass through an iterative array representation of a sequential circuit.

Such a test pattern generator should use a data structure having size equal to that of the data structure used during an initial combinational time-frame.

It should be unnecessary to predict a maximum number of time-frames that may be needed.

Finally, for all faults during all subsequent time-frames, the test pattern generator should reuse the path-enabling functions created during the initial combinational time-frame.

SUMMARY OF THE INVENTION

These goals and others that will become apparent are met by the present invention, which implements single-pass methods for generating test patterns for sequential circuits.

A specific embodiment of the invention defines a method for generating test patterns for sequential circuits wherein faults arriving at circuit next-state lines are mapped into good next-state fault objects, permitting fault-propagation and path-enabling function size to be bounded by a size established during an initial time-frame.

The method permits path-enabling functions created during a first time-frame to be saved and reused during subsequent time-frames.

The method also permits a search for test patterns to continue from one time-frame to a next until a valid test pattern is found for each fault, or until it is determined that no test patterns exist for any remaining faults.

In another specific embodiment, the method begins by receiving a netlist defining a sequential circuit. The netlist is sorted, and during an initial time-frame, combinational test pattern generation is performed on the sorted netlist, and path-enabling functions are created and saved for reuse during all subsequent time-frames.

An inter-time-frame process is placed between time-frames. During an inter-time-frame process, faults arriving at next-state lines are broken down into separate state/input vectors and mapped to good next-state fault objects. These objects are placed onto the present-state lines of a next time-frame, and the process continues. A history of the mapping is saved in a history file.

Fault objects reaching circuit primary output lines indicate potential test patterns have been found. The test patterns are extracted from the history file and are then validated. Invalid test patterns are discarded. Faults having valid test patterns are dropped from further consideration. At the end of the process, the valid test patterns are provided to a user.

BRIEF DESCRIPTION OF THE DRAWING

FIG. 8 is a pseudo-code description of a fault decomposition process for use during a first phase of an inter-time-frame process.

FIG. 9 is a pseudo-code description of a purge-posting process for use during a second phase of an inter-time-frame process.

FIG. 10 is a pseudo-code description of a process for extracting test patterns from stored data tables as part of a method for generating test patterns for sequential circuits.

FIG. 11 is a pseudo-code description of a process for determining the validity of extracted test patterns.

FIG. 12 is a block diagram of a simple sequential circuit used in an example.

FIG. 16 is a table showing fault objects at next-state lines at end of Time-Frame[1].

FIG. 17 is a table showing records created during fault-decomposition phase of the inter-time-frame process following Time-Frame[1].

FIG. 18 is a table showing records completed during purge-posting phase of the inter-time-frame process following Time-Frame[1].

FIG. 19 is a table showing new search objects and replacement local faults created during purge-posting phase of the inter-time-frame process for use during Time-Frame [2].

FIG. 20 is a table showing fault objects at next-state lines at end of Time-Frame[2].

FIG. 21 is a table showing updated records following the inter-time-frame process following Time-Frame[2].

FIG. 22 is a table showing new search objects and replacement local faults created during purge-posting phase of the inter-time-frame process for use during Time-Frame [3].

FIG. 23 is a table showing fault objects at primary output line at the completion of Time-Frame[3].

FIG. 24 is a table illustrating the extraction of test pattern sequences.

FIG. 25 is a table illustrating the validation of extracted test pattern sequences.

DESCRIPTION OF THE PREFERRED EMBODIMENT

Introduction

Figure 1:
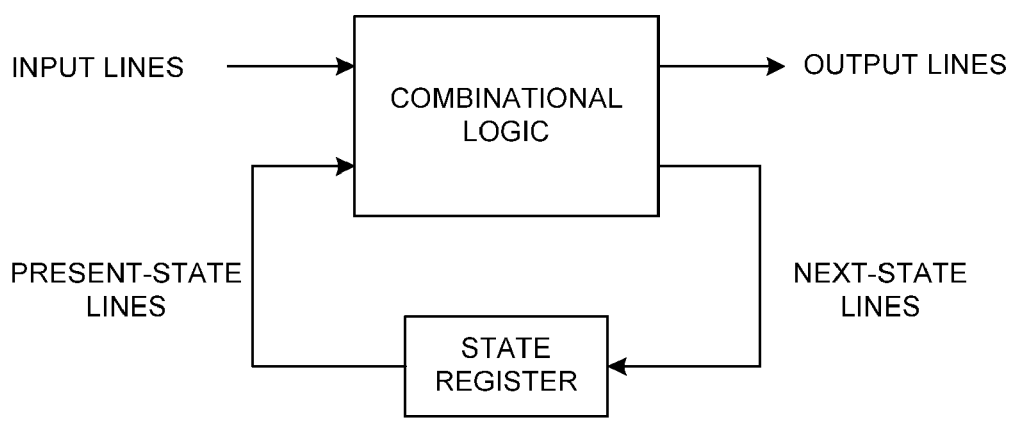
FIG. 1 is a prior art block diagram illustrating a sequential circuit partitioned into a combinational part and a separate state register part.
Figure 2:
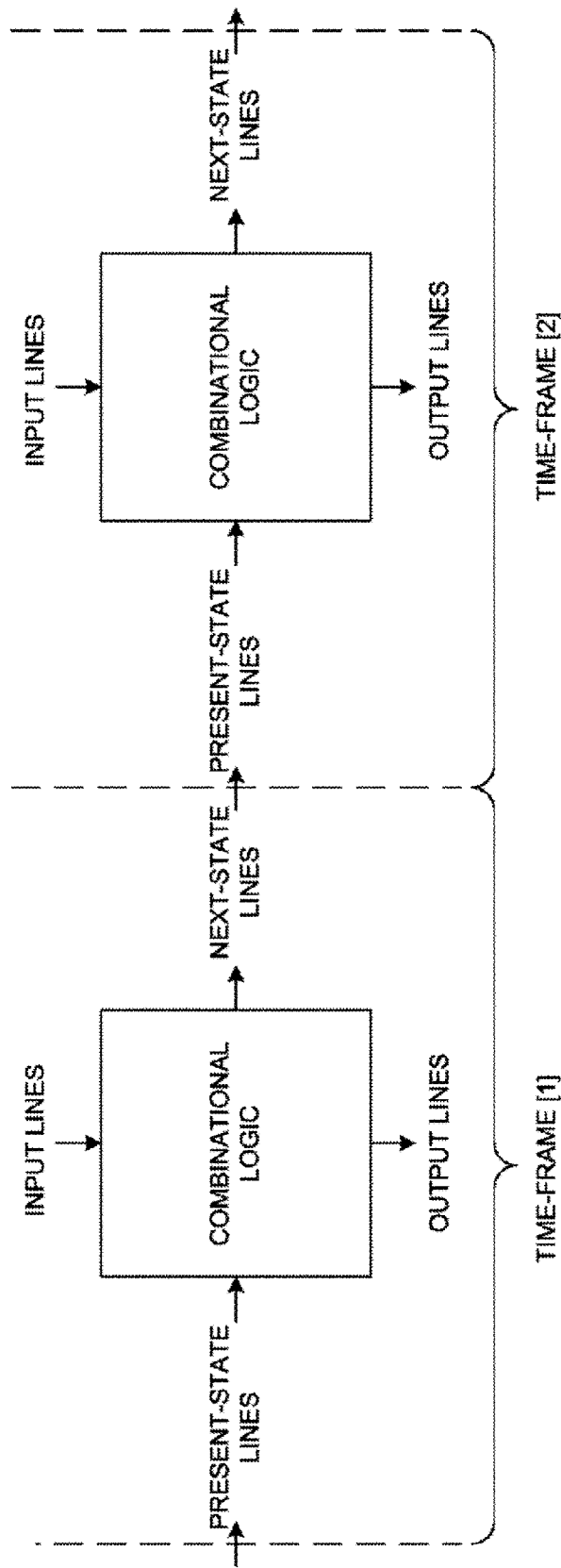
FIG. 2 is a prior art block diagram illustrating a sequential circuit represented as an iterative array of the combinational parts.

U.S. Pat. No. 6,789,222 illustrates that Boolean fault-propagation functions, path-enabling functions, and the logic element rules for combining these functions define an inductive structure on a combinational circuit's netlist and logic elements. In the methods defined therein, a received netlist is sorted into an ascending circuit-level order. Initial Boolean functions are applied to circuit primary inputs, and the rules are iteratively applied, logic-element-by-logic-element, and circuit-level-by-circuit-level until fault propagation functions appear at primary output lines. These fault-propagation functions define all primary input vectors that make faults detectable at the outputs. The method is adapted to detecting test patterns for batches of single stuck-at faults during a single pass through the sorted netlist.

In the present invention, a similar technique is applied to a sequential circuit represented as an iterative array of the combinational parts of the circuit. Each copy of the circuit in the array contains a copy of the fault. The method uses the single stuck-at fault model, and it is believed that the method can be adapted for other standard fault models. The method is adapted to detecting test pattern sequences for batches of single stuck-at faults during a single pass through the sorted netlist of a sequential circuit.

A mapping step is inserted between adjacent time-frames of the iterative array. Fault-propagation functions arriving at next-state lines are mapped into new search objects for a next time-frame. The mapping makes it possible to maintain a data structure size established during a first time-frame for use during all subsequent time-frames. Thus, path-enabling functions created during a first time-frame are saved and reused for all subsequent time-frames.

For purposes of this method, a sequential test pattern commences at a present-state/primary input vector combination that activates a fault, and continues time-frame-by-time-frame until the fault appears at a primary output line. The sequential test pattern is defined as the concatenation of an activation present-state/primary input vector combination and additional primary input vectors-one per each subsequent time-frame-necessary for propagating the fault to a primary output line. The test pattern also includes a final good next-state to which the circuit will advance, an identification of the primary output line at which the fault appears, and the fault-free logic level of that primary output line. This definition for a sequential test differs from the common definition in which a test is assumed to begin at some initial state, such as a system reset state, and typically includes a sequence of input vectors necessary to advance from the initial state to a fault-activation state.

The sequential tests defined here are combined to form concatenations of tests for different faults. A sequence of test vectors causes a fault-free copy of a circuit to arrive at a known state and to stop just prior to a known good next-state. A second test sequence is selected that commences with the known good next-state of a previous test sequence. The second test sequence is concatenated to the end of the first test sequence. This process of test sequence selection and concatenation continues until test sequences for all detectable faults of a batch have been concatenated. Bridging sequences are created when necessary to form transitions between a final state of one test and an initial state of a second test when no match can otherwise be found. Efficient concatenations of this type are created using techniques such as those disclosed in U.S. Pat. No. 5,586,125, the full disclosure of which is incorporated by reference herein.

A first time-frame is purely combinational. Path-enabling functions are created for each net of the circuit and are saved for use during subsequent time-frames. An attempt is made to activate and propagate every fault designated in a subset of all the circuit faults to a primary output or to one or more next-state lines. Faults that cannot be activated and propagated to a primary output or to a next-state line are undetectable. Faults that reach a primary output are removed from the subset of faults for which test patterns are being sought. Potentially detectable faults that do not reach a primary output will appear at one or more next-state lines.

A preferred combinational test pattern generator for use with the present invention is disclosed in U.S. Pat. No. 6,789,222. It should be noted that a specific embodiment of the present invention processes multiple faults during a single batch. However, any generator is suitable so long as it can activate and propagate a fault to all the next-state lines at which the fault will appear in an actual faulty circuit.

During the inter-time-frame process between the first and a second time-frame, the Boolean functions representing fault-propagation functions of faults arriving at the next state lines are mapped to permit the same size data structure that was used during the first time-frame to be used during the second time-frame. This mapping operation occurs during a two-phase inter-time-frame process and is described more fully below. Work is required to map the functions to new search objects in order to maintain a constant data structure size. The benefit gained from this work is two-fold: (1) the effort expended during each time-frame is minimized, and (2) the path-enabling functions created during a first time-frame are reusable during all subsequent time-frames.

Each time-frame after the first works with fault objects (new search objects) that are passed to it from the preceding inter-time-frame process. A copy of each fault is instantiated as a modified local fault within each subsequent time-frame. The modified local fault will interact with the fault being propagated through the time-frame as required by the circuit. When a fault reaches a primary output, a test pattern sequence is extracted from the output and history files at the end of the time-frame. The test pattern sequence is validated to eliminate invalid test pattern sequences. If the test pattern sequence is valid, the fault is removed from the subset of faults for which test pattern sequences are being sought. Otherwise, the fault is permitted to remain and the invalid test pattern sequence is discarded. Remaining faults that reach at least one next-state line are passed to the next inter-time-frame process.

Figure 3:
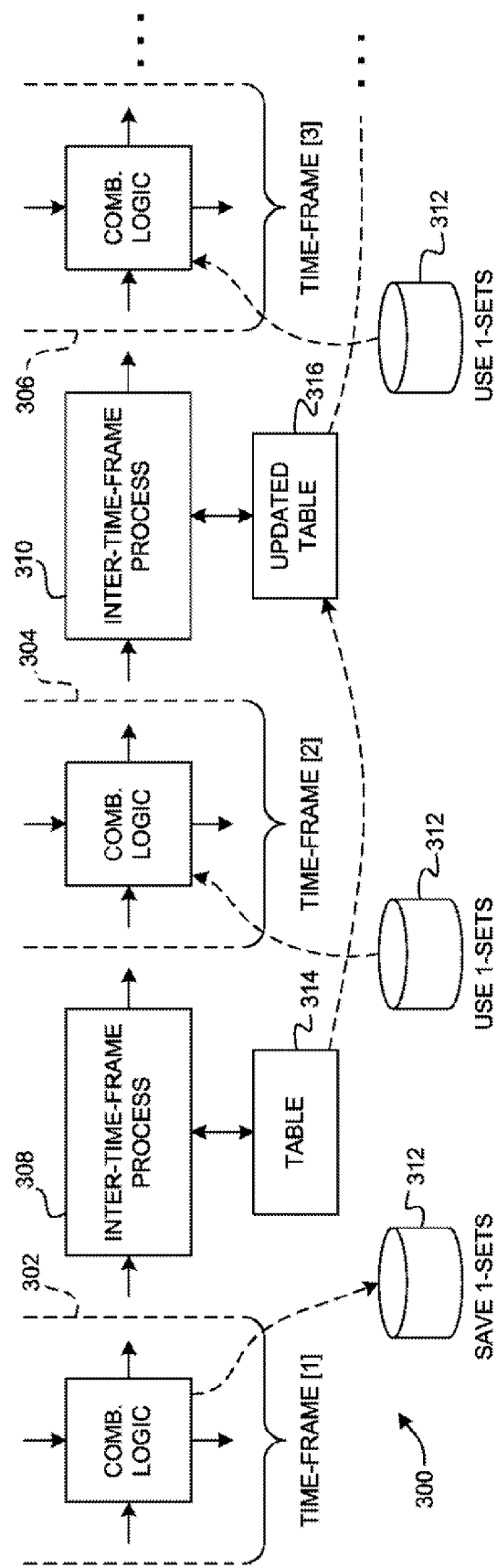
FIG. 3 is a block diagram illustrating an iterative array representation including a two-phase inter-time-frame process between each time-frame according to one aspect of the present invention.
Figure 4:
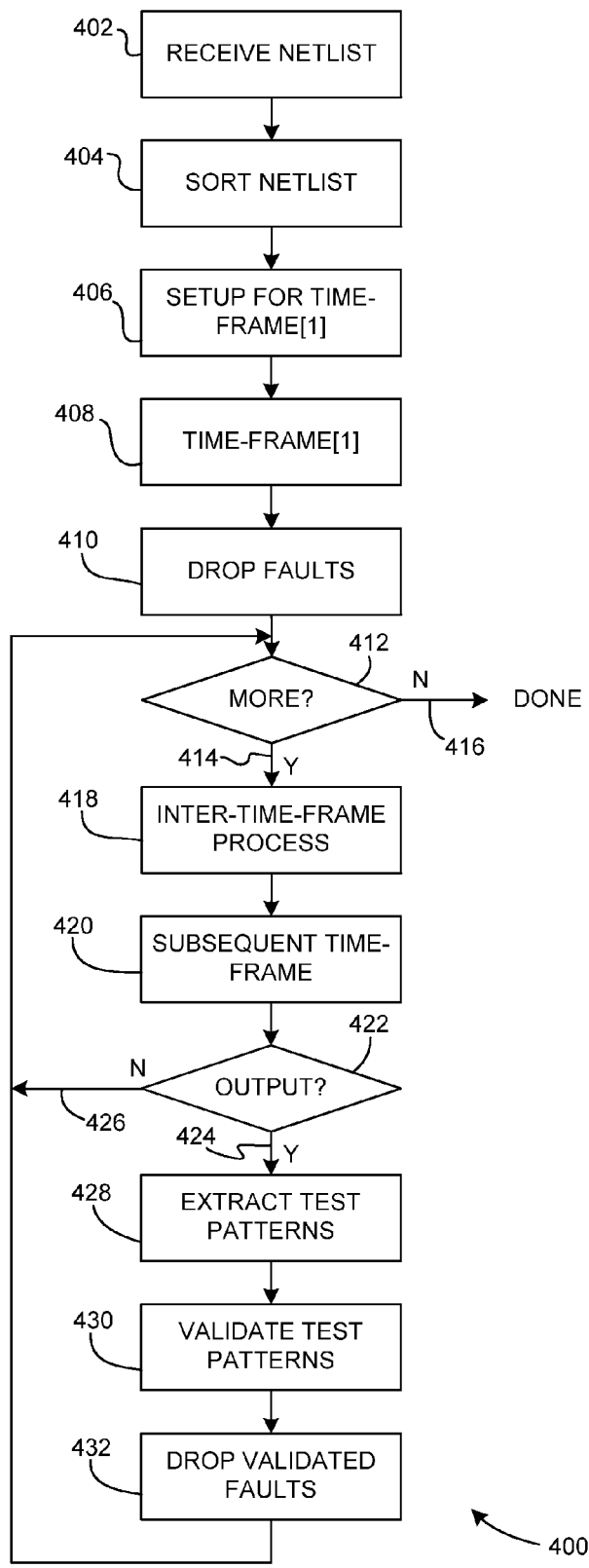
FIG. 4 is a flow chart illustrating a process for generating test patterns for sequential circuits according to another aspect of the present invention.
Figure 5:
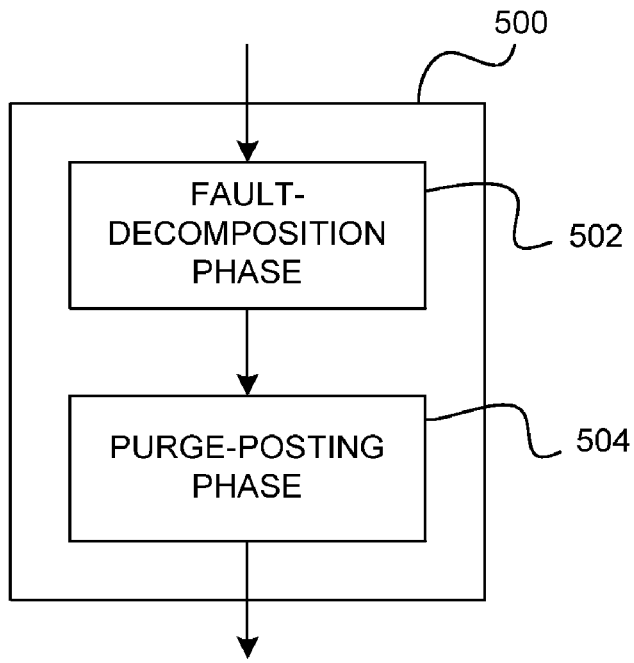
FIG. 5 is a partial flow chart illustrating a two-phase inter-time-frame process.
Figure 6:
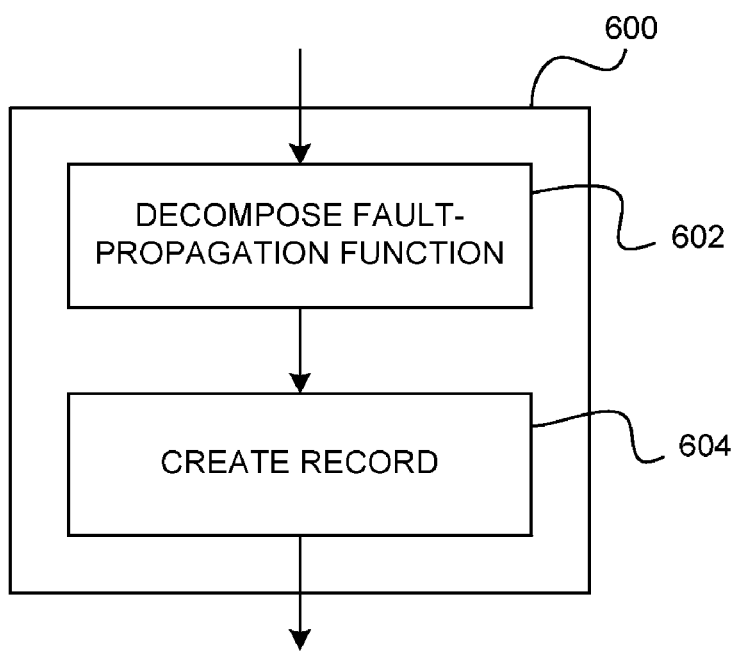
FIG. 6 is a partial flow chart illustrating a fault-decomposition phase of an inter-time-frame process.
Figure 7:
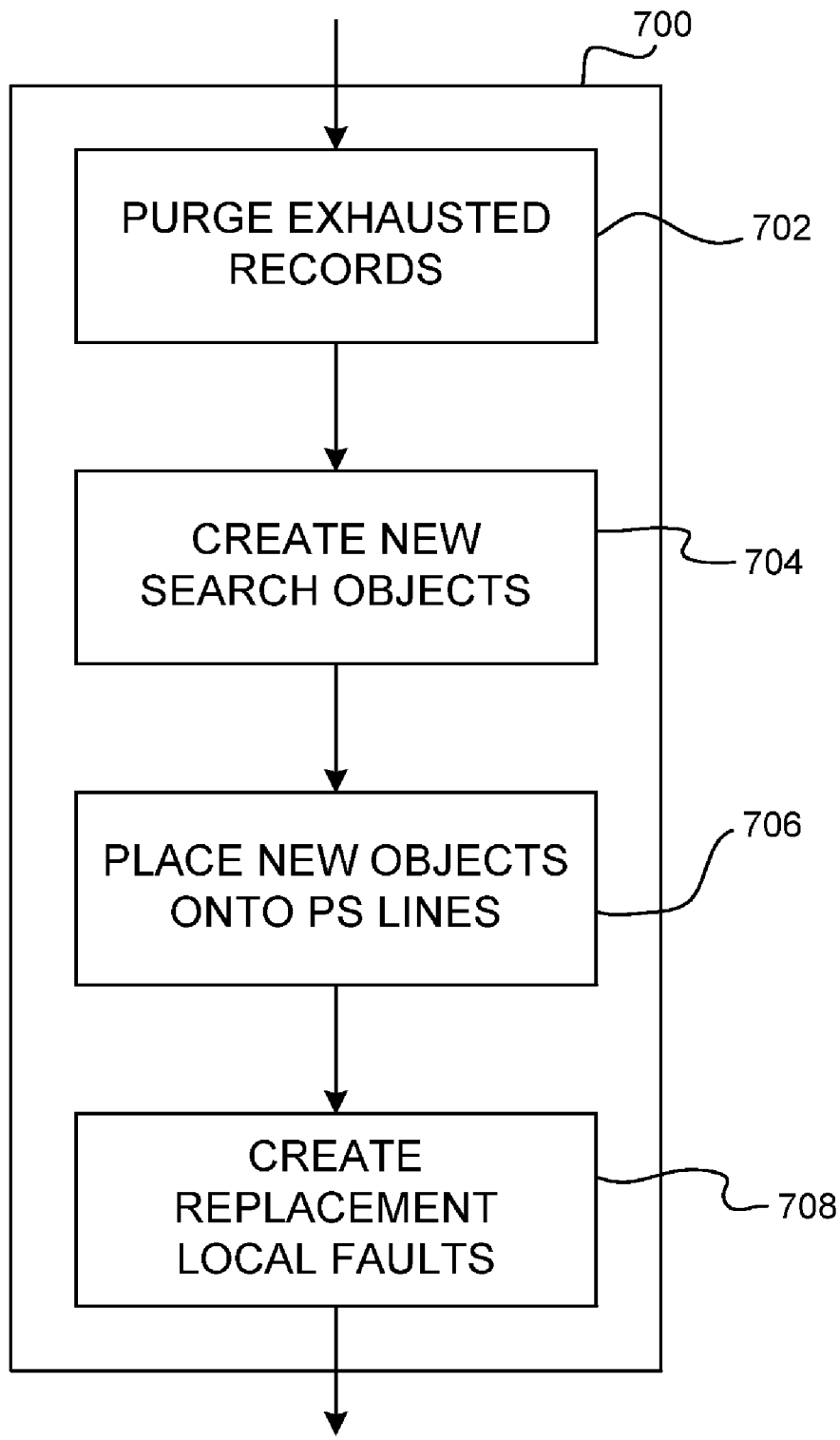
FIG. 7 is a partial flow chart illustrating a purge-posting phase of an inter-time-frame process.

FIG. 3 illustrates details of this process, showing an inter-time-frame process inserted between adjacent time-frames of an iterative array representation of a sequential circuit. FIG. 4 illustrates a specific method for generating test patterns for sequential circuits. FIGS. 5, 6 and 7 illustrate the phases of an inter-time-frame process and major components of a purge-posting phase. FIGS. 8 and 9 use pseudo code to define the two phases of an inter-time-frame process. FIG. 10 uses pseudo code to define a fault extraction process, and FIG. 11 illustrates a process for validating extracted test patterns.

Principles of Operation

In a specific embodiment—and considering the progress of a single fault only for purposes of simplification—a single stuck-at fault will be activated and propagated to one or more next-state lines during a first time-frame. The fault-propagation function for the fault will be decomposed into distinct state/input vectors ("S/I's"). Each S/I will be mapped to a good (i.e., fault-free) next-state. Each good next-state will be concatenated with a don't-care input vector part to form a fault-propagation function for a new search object. The new search object will be placed onto present-state lines corresponding to the same next-state lines at which the fault arrived during a preceding time-frame. A modified combinational test pattern generation will attempt to propagate the new search objects to one or more primary output lines or next-state lines during a next time-frame.

A modified combinational test pattern generation differs from a combinational test pattern generation in that naturally arising local faults in the latter are inhibited in the former. Replacement local faults are substituted in their place. A local fault is a fault-propagation function that activates a fault at a circuit net. It has one or more distinct S/I's. A replacement local fault uses the I-part of a distinct S/I from Time-Frame[1]. A replacement local fault is constructed for each new search object and has the same good next-state as the new search object concatenated with the TF[1]I-part. A replacement local fault is able to interact with a new search object during modified combinational test pattern generation. The proper TF[1]I-part for use in a replacement local fault is the TF[1]I-part of the initial time-frame ancestor of the new search object. The TF[1]I-part may be a composite of several I-parts when each is an ancestor for the new search object.

FIG. 3 is a block diagram illustrating an iterative array representation including a two-phase inter-time-frame process between each time-frame according to one aspect of the present invention, and forming a composite array. The composite array is designated generally by the reference numeral 300 and includes a first time-frame 302, a second time-frame 304, a third time-frame 306, an inter-time-frame process block 308, a second inter-time-frame process block 310, storage 312 for saving path-enabling 1-sets, and for providing the saved 1-sets at subsequent time-frames, a table 314, and an updated table 316. FIG. 3 is exemplary only, a specific composite array may include, for example, a different number of time-frames.

During a first time-frame 302, the methods taught by U.S. Pat. No. 6,789,222 will find test patterns for all combinationally detectable faults. Faults that are potentially sequentially detectable will appear at the next-state lines as fault objects including a fault-propagation function.

In a specific embodiment, the 1-set is the preferred path-enabling function. All 1-sets created during the first time-frame are stored 312 for reuse during subsequent time-frames (note that 0-sets are also required for path-enabling, and that in another specific embodiment the 0-sets are derived by complementing the saved 1-sets). In another specific embodiment, as taught in U.S. Pat. No. 6,789,222, no longer needed Boolean function storage is released for reuse.

A fault-propagation function is a Boolean function of the present-state lines and the primary input lines. During a first time-frame a fault-propagation function represents each present-state/primary input vector that activates and propagates a fault to a specific net within the circuit. Fault propagation functions that have arrived at next-state lines at the end of the first time-frame represent present-state/primary input vector combinations that activate and propagate a fault to one or more of the next-state lines.

A specific embodiment of the method for generating test patterns for sequential circuits begins with a purely combinational time-frame (Time-Frame[1], 302), followed by an inter-time-frame process 308 that creates new search objects for a next time-frame (Time-Frame[2], 304). Thereafter, each time-frame is followed by the creation of new search objects, and so on until no faults remain to be detected, no tests exist for remaining faults, or the process is halted. A table 314 that keeps track of the new objects and the search history is created during an initial inter-time-frame process 308, and is updated 316 during each subsequent inter-time-frame process 310.

As the method works its way through the composite iterative array, faults will appear at the primary output lines, indicating that a test pattern sequence for a fault has been identified. Faults that continue to be potentially, but are not yet detectable appear at one or more next-state lines. Note that the detail of test pattern sequence validation is omitted from FIG. 3 for simplification.

Faults that reappear at the next-state lines of subsequent time-frames in a repeated configuration—without appearing at a primary output line—are purged because no test sequence for such faults exists. Such faults are sequentially undetectable in that, though they can be activated and perhaps propagated through a number of successive time-frames, they cannot be successfully propagated to a primary output during any time-frame.

The utility of purging becomes clear when a fault object appears at the same next-state lines during two consecutive time-frames. Such objects do not lead to detectable test sequences and are purged to reduce unnecessary work. The cycle of repetition can be longer than two time-frames however, and when a fault appears at next-state lines in a previously observed configuration, the fault object is purged. Purging is one of the effective means for controlling the number of search objects progressing through the search process.

Upon completion of a final time-frame, the successful test pattern sequences are reconstructed using the updated table entries (316 of FIG. 3).

It will be appreciated that the storage 312, though indicated as rotating memory can also be other memory accessible to a computer, for example a computer's internal memory (RAM). The use of computer internal memory is preferred because it permits the entire process to execute more rapidly.

FIG. 4 is a flow chart illustrating a process for generating test patterns for sequential circuits according to another aspect of the present invention. The process is designated generally by the reference numeral 400 and includes a step 402 for receiving a netlist description of a sequential circuit, a step 404 for sorting the netlist into an ascending circuit-level order, a step 406 for initializing storage locations corresponding to the nets for the primary input lines and the present-state lines, a step 408 representing combinational test pattern generation for a first time-frame of an iterative array representation of the sequential circuit, a step 410 for removing faults from a list of faults for which tests are sought when a test has been found following a first time-frame (referred to as "dropping faults"), a step 412 for determining whether faults are present at one or more next-state lines, a step 418 for initializing storage locations corresponding to the nets for the primary input lines and the present-state lines for each subsequent time-frame of the iterative array (referred to as an "inter-time-frame process"), a step 420 for performing a modified combinational test pattern generation for subsequent time-frames of the array, a step 422 for determining whether any fault has arrived at a primary output line, a step 428 for extracting test patterns from a history file when a fault has arrived at a primary output line following a subsequent time-frame, a step 430 for validating such test patterns, and a step 432 for dropping faults for which validated test patterns have been found (referred to as "dropping validated faults").

A received netlist is sorted (step 404) into an ascending circuit level order commencing at the level of the primary inputs and the present-state lines. In a specific embodiment, the netlist is sorted so that net definitions may be located rapidly, while a separate list of all net names is created and is sorted, at step 404, into an ascending circuit level order.

The setup for the first time-frame (step 406) creates and stores 1-set Boolean functions and initial local fault Boolean functions for each primary input line and for each present-state line. The local fault is a Boolean function of present-state/primary input vectors that activate a given fault at its source net.

At the completion of the first time-frame (step 408), combinationally detectable faults are present at one or more primary outputs. In a specific embodiment, these faults are removed from the list of faults to be detected ("drop faults", step 410), and are added to a list of detected faults. Undetected faults, if they have been successfully activated and propagated, appear at one or more of the next-state lines in the form of fault-propagation functions. A test is made at step 412 to determine whether any fault has reached a next-state line. If so ("Y", 414), the process continues at step 418. If not ("N", 416), the process is complete ("DONE").

The setup for all subsequent time-frames (step 418, referred to herein as the "inter-time-frame process") relies on 1-sets created and saved to storage before and during the first time-frame. The specific details of the setup are described with respect to FIGS. 8 and 9, but include the creation of new search objects at the present-state lines, the creation of replacement local faults for use during a next time-frame, and the creation of history table entries permitting the reconstruction of valid test pattern sequences at the end of a time-frame.

The subsequent time-frame step 420 differs from the first time-frame step 408 in at least two important respects: (1) in a specific embodiment, 1-sets stored before and during the first time-frame are reused during all subsequent time-frames so that computational efficiency is enhanced; and (2) the local fault generation process used during the first time-frame (fault activation) is replaced during the subsequent time-frames by use of modified local faults created and saved during a preceding inter-time-frame process (step 418). These modified local faults are referred to as replacement local faults.

In another specific embodiment the 1-sets are not saved during the first time-frame, and no-longer-needed storage is released so that larger circuits and circuit partitions can be handled (see U.S. Pat. No. 6,789,222). Instead, the 1-sets are recreated during each subsequent time-frame. Though able to handle larger circuits/partitions, a person having an ordinary level of skill will appreciate that operating in this manner is often less efficient because of the need to recreate the path-enabling 1-sets during each time-frame.

At step 422 a test is performed to determine whether any fault has reached a primary output line following a subsequent time-frame. If so ("Y", 424), the process continues at step 428. If not ("N", 426), the process continues from step 412.

When an output has been detected following a subsequent time-frame, a potential test pattern sequence for a fault has been detected. At step 428 the fault propagation function at a primary output line is combined with selected entries in the history table to extract a potential test pattern sequence. Potential test pattern sequence extraction is more fully defined below with reference to FIG. 10.

The mapping operation used during an inter-time-frame process (step 418) maps each of the S/I's into which a fault-propagation function is decomposed into a specific good next-state.

A valid test pattern sequence will produce one output level when the test pattern sequence is applied to a fault-free ("good") copy of the circuit, and will produce an opposite output level when the test pattern sequence is applied to a faulty ("bad") copy of the circuit. This process is referred to as test pattern validation (step 430), and will be described in greater detail below with respect to FIG. 11.

At step 432 validated test pattern sequences are saved and the faults to which they correspond are dropped from the list of faults for which tests are sought. Invalid sequences are discarded. The process continues at step 412.

FIGS. 5, 6 and 7 are intended only to provide a frame of reference for understanding how the details presented in FIGS. 8 and 9 relate to the overall inter-time-frame process that is inserted between each pair of adjacent time-frames of a composite iterative array (300 of FIG. 3).

FIG. 5 is a partial flow chart illustrating a two-phase inter-time-frame process. The two-phase inter-time-frame process is designated by the reference numeral 500 and includes a fault-decomposition phase 502 and a purge-posting phase 504.

FIG. 6 is a partial flow chart illustrating a fault-decomposition phase of an inter-time-frame process. The fault-decomposition phase is designated by the reference numeral 600 and includes a step 602 for decomposing a fault-propagation function and a step 604 for creating a record of the fault-decomposition as part of a search history.

FIG. 7 is a partial flow chart illustrating a purge-posting phase of an inter-time-frame process. The purge-posting phase is designated by the reference numeral 700 and includes a step 702 for purging exhausted records, a step 704 for creating new search objects, a step 706 for placing (i.e., posting) the new search objects onto the present-state lines of a next time-frame, and a step 708 for creating replacement local faults for use during a next time-frame.

Details of operation of the two phases of an inter-time-frame process are provided by FIGS. 8 and 9 and the discussion related thereto. Every fifth line of the pseudo code shown in FIGS. 8, 9, 10 and 11 has been numbered. Reference in the description to an unnumbered line requires interpolation from the numbered lines.

Fault-Decomposition Phase

In a specific embodiment, and for purposes of the description that follows, a single stuck-at fault is an object having the form <fault-name, integer label, fault-propagation function>. Thus when a single stuck-at fault arrives at one or more next-state lines, such a fault object will be present at those lines.

FIG. 8 is a pseudo code description of a fault decomposition process for use during a first phase of an inter-time-frame process. Fault objects that have arrived at the next-state lines at the end of a time-frame are considered one next-state line at a time ("for each NS line", line 2), then each fault-name is considered separately ("for each fault-name", line 3), and for fault objects having a common fault-name and different labels, each label is considered separately ("for each label", line 4).

A fault-propagation function is either empty or it contains at least one present-state/primary input vector combination. In a specific embodiment, empty fault-propagation functions are normally purged from the system because they do not contribute to any valid test pattern and require additional computational effort.

A fault-propagation function is decomposed into its constituent S/I's (at line 5), where "S/I" refers to present-state/current primary input vector (or simply state/input vector). The individual S/I's are now treated separately, commencing at line 6.

Line 7 asks whether a record exists that shares characteristics of the current S/I under consideration. During an inter-time-frame process (308 of FIG. 3) between Time-Frame[1] and Time-Frame[2] such records are being created and placed into a RECORD TABLE (314 of FIG. 3). In a specific embodiment, the RECORD TABLE is a collection of records forming a history of the search for test patterns.

The format for such a record is defined at lines 12-14 of FIG. 8. The fault-name is the name of the fault, usually the name of a circuit signal or net plus a symbol to indicate whether the signal is stuck-at-1 or stuck-at-0, for example ABCD/1, meaning signal ABCD stuck-at-1. The TF[1]I-part is the primary input vector that, combined with a present-state, activated the fault at its signal/net during Time-Frame [1]. A TF[1]I-part is sometimes referred to herein as an earliest ancestor of the fault object. The current-label, current-S, and current-I are the label, the decomposed S-part and the decomposed I-part of the fault object that is being processed.

In a specific embodiment of the invention, examination of the records within the RECORD TABLE is handled by a simple data-base engine capable of locating any records that match given criteria. If there exists a record matching the criteria provided in the pseudo code of FIG. 8 at lines 7 and 8, the record's next-state line flag is set corresponding to whichever next-state line is being processed. The purpose of a next-state line flag is to maintain a record of which next-state line(s) a given fault object appears at. A next-state line flag is an element of a field in which each next-state line has a separate flag. Mapped fault objects will be placed onto corresponding present-state lines for a next time-frame. In other words, if there are three state lines numbered 0, 1 and 2, then if a fault appears at next-state lines 0 and 2, but not line 1, a new search object will be posted to present-state lines 0 and 2, but not line 1 for a next time-frame, i.e., corresponding lines. The same record can be updated as each next-state line is processed, permitting a single record to reflect the presence or absence of a fault at a next-state line by controlling the state of that line's next-state line flag.

If no such record exists (line 10), a new record is created and is placed into the RECORD TABLE. FIG. 8, lines 15 and 16 indicate what information is to be placed initially into the new record.

Next, a good next-state is determined based upon the current-S and current-I of the decomposed fault-object being processed. A good next-state is computed using a State Transition Graph (or the equivalent) for the sequential circuit for which test sequences are being sought. The good next-state is the state to which a fault-free copy of the sequential circuit would advance given the current-S and current-I of the decomposed fault object being processed. The current-S and current-I that have brought the fault object to a specific next-state line at the end of a time-frame are mapped to a next-state that a good copy of the circuit would advance. This next-state is referred to as the good next-state. At this point the new record's good next-state and the specific next-state line flag is set (FIG. 8, lines 18 and 19).

The process continues for each decomposed S/I (line 6), then label (line 4), then fault-name (line 3), and finally each next-state-line (line 2) until every fault object at each next-state line at the end of the current time-frame has been processed and records have been created or updated and saved in the RECORD TABLE.

What is going on here is that each path of fault propagation through the just-completed time-frame has been analyzed and a new record created and saved linking this portion of the path to its parent. The current S/I has been mapped to a good next-state, and the next-state line flags have been set to indicate at which next-state lines a fault object related to a common parent appeared.

A person having an ordinary level of skill in the art will appreciate that these paths can be constructed in ways other than the records being used here. The paths can, for example, be implemented as forward-and-backward linked lists, also as tree structures and the like.

The decomposition of fault-propagation functions into separate S/I's results in a simplification of a data structure by creating multiple simple data structures going forward. The number of simple data structures tends to increase at each inter-time-frame process, but, as mentioned above, there are processes operating that tend to control the increase in the number of these simple data structures over time. The simple data structure being referred to is the fault-propagation function portion of the fault object. It is simple in that its size is just sufficient to represent a present-state plus one primary input vector. This size of course can be quite large for many industrial strength circuits.

Purge-Posting Phase

FIG. 9 is a pseudo code description of a purge-posting process for use during a second phase of an inter-time-frame process. At line 2 records whose new-label field has not yet been set are identified. These are new records created during the immediately preceding fault-decomposition phase (FIG. 8). Each of these records is examined in turn (line 3). Each record's fault-name, TF[1]I-part, good next-state, and its next-state line flags are compared with all other records sharing those same criteria but having previously assigned (non-blank) new-labels (lines 4-8). If such previous records exist, eliminate the new records not yet having been assigned new labels (line 12). The decomposed fault objects that resulted in the creation of these new records lie on paths that have been previously explored without producing test sequences. The records being eliminated relate to paths that arrive at next-state lines in a cyclic pattern that will never reach a primary output line. As a result of this elimination, new search objects will not be created and computational efficiency will be improved. The process of identifying and eliminating these records is referred to as "purging."

New records that are not purged will result in new search objects being created and placed onto (i.e., posted to) present-state lines for a next time-frame. At line 16 all new records (those not yet having a new-label assigned) are sorted into groups sharing a common fault-name, TF[1]I-part, good next-state, and next-state line flags (this collection of record fields being referred to as a "pattern," and sometimes as an "association").

In a specific embodiment, the "sort" is accomplished using the basic data-base engine to select all new records sharing a common pattern. Each of the sorted groups will be represented going forward by a common new search object, one distinct new object per group. This collapsing or converging step tends to reduce the number of search objects going forward.

At line 17 a new-label is obtained (in a specific embodiment, the labels are simply consecutive integers). Each group now gets a different new label assigned. All records within a given group are assigned the same new-label. Thus all new records sharing the same pattern are assigned the same label, and multiple paths converge into a single path going forward.

A new search object is now created for each such group (lines 21 and 22). In a specific embodiment, the new search object has the following format: <fault-name, new-label, good next-state, I-dontcare>. The "I-dontcare" is an input vector in which each literal (primary input signal/net) is assigned a "don't care" level, for example, in a system in which the logic level of any literal is represented by a two-bit binary code, 00 means the literal is not present, 01 means level "1", 10 means level "0", and 11 means "don't care." The good next-state and the I-dontcare form a single fault-propagation function so that the new search object is in actuality a fault object having the familiar form <fault-name, integer label, fault-propagation function>.

Each new search object is now placed onto (i.e., posted to) the present-state lines for a next time-frame according to the next-state line flags for the record(s) that correspond to the new search object. Each next-state line flag was set during the initial fault-decomposition phase (FIG. 8, lines 9 and 19). Thus a new search object is placed onto the present-state lines of a next time-frame that correspond to the next-state lines of the immediately preceding time-frame at which the fault appeared.

The next step requires creation of a replacement local fault, one for each new search object that is placed on the present-state lines for the next time-frame (lines 24 and 25). A local fault placed onto a net during a first (combinational) time-frame is a function of every present-state/primary input vector combination that activates the fault at the output of the logic element driving the faulty net. The replacement local fault will be substituted during subsequent time-frames for that combinational local fault. The replacement local fault will have the same I-part as that original local fault (the TF[1]I-part) but will use the good next-state S-part of the search objects with which it will interact to produce a valid result. Thus in a specific embodiment the format for a replacement local fault is <fault-name, new-label, good next-state, TF[1]I-part >(line 25). The replacement local fault is saved for use during the next time-frame (lines 26 and 27).

The fault-decomposition process (FIG. 8) has separated each fault-propagation function into its constituent S/I's. A specific one of the S/I's will be descended from a specific one of the S/I's of the local fault at Time-Frame[1]. Thus there will be only one TF[1]I-part for any specific replacement local fault being constructed. The TF[1]I-part is carried forward from Time-Frame[1] into each new record of descendant search paths, and is thus referred to as an "earliest ancestor."

Finally, the posted flag of all records having a blank posted flag field are set to indicate that a record is associated with a new search object (lines 30 and 31).

In a specific embodiment, time-frames continue to be processed as described above until every fault for which test sequences is sought reaches a primary output line and is validated, or until the process is otherwise terminated.

Test Pattern Extraction

FIG. 10 is a pseudo code description of a process for extracting test patterns from stored data ("history") tables as part of a method for generating test patterns for sequential circuits. The information needed to extract test pattern sequences is contained in the fault objects that reach a primary output line and within the records stored in the RECORD TABLE.

In a specific embodiment fault objects reaching a primary output line are used to create records that are saved in the RECORD TABLE. In such an embodiment the record format includes the name of the primary output line at which the object arrives.

The extraction process defined in FIG. 10, however, relates to a different specific embodiment in which fault objects reaching primary output lines are saved with the name of the output line.

Thus at FIG. 10, line 2 "for each primary output line" indicates that the lines are processed one output line at a time. And at line 3, fault names appearing at the output line are processed one fault name at a time. At line 4, labels within each fault-name are also processed one label at a time.

In a specific embodiment the objects that appear at a primary output line have the format <fault-name, label, fault-propagation function> (FIG. 10, line 5). The S-part for the fault-propagation function is the next-good-state that was made a part of the search object that has arrived at the output line. The fault-propagation function is decomposed into that S-part and all its I-parts (lines 6 and 7).

In a specific embodiment, consecutive integers are assigned as labels for each fault-name. Thus, for example, Time-Frame[1] will use a label "0" for each fault object (also referred to as a "search object"). During Time-Frame [2], a first search object for a specific fault-name will be assigned the integer label "1" and a second search object for the same fault-name will be assigned the integer label "2," and so on, so that each search object of a given fault-name has a unique label. Assume the last label assigned during Time-Frame[2] for a given fault-name was "12." Then the next label assigned for a search object for that fault-name for use during Time-Frame[3] will be "13," and so on. Labeling is a solution to the problem of having different search objects-possibly one for each S/I of a decomposed fault-propagation function-for a single fault-name. Recall that this method finds test patterns for all single stuck-at faults of a subset of faults during a single forward pass through the iterative array. Thus some means must be provided to insure that search objects interact only with the same search object and replacement local fault (which have the same fault-name and label) as the objects work their way through a time-frame.

At line 11 the extraction process selects all records in the RECORD TABLE sharing a common fault-name and label (in the new-label field). These are all the records derived from search objects that mapped to the new label.

If there is at least one such parent record (FIG. 10, line 14), get the contents of the current-I field and determine whether a test pattern sequence is currently being constructed (lines 18-20). If so, append the current-I to the right-hand end of the sequence, else, begin construction of a new test pattern sequence (lines 24-33).

If no such parent record exists (FIG. 10, line 36), you are currently at the first time-frame. Determine whether a test pattern sequence is currently being constructed (lines 38-40). If so, append the current-I to the right-hand end of the sequence, else, begin construction of a new test pattern sequence (lines 46-54). Note that the specific format used presents a test pattern sequence in a reversed order.

The process defined by the pseudo-code of FIG. 10 will construct every detected test sequence for every fault that reaches a primary output line. A person having an ordinary level of skill in the art will appreciate that alternative data structures can be used to store the information needed to construct test sequences. For example, a tree structure can be adapted for such use rather than the table of records and simple data-base engine used here.

Test Pattern Validation

Test patterns found at the completion of the first time-frame are valid. Test patterns found at the completion of a subsequent time-frame require validation.

FIG. 11 is a pseudo-code description of a process for determining the validity of extracted test patterns. For each fault that has arrived at a primary output line and has an extracted test sequence (line 2), the process creates faulty 1-sets commencing with the faulty net (line 3), then saves the faulty 1-sets for the next-state lines and the primary output lines (lines 4-5).

Next, each extracted test sequence for a given fault is applied to the saved faulty next-state line 1-sets to create a faulty state sequence (lines 6-8). Once a faulty state sequence has been created, the final state of the faulty state sequence is concatenated with the final input vector of the extracted test sequence (lines 9-10). For example, assume the final state of the faulty state sequence is "S14," and assume the final input vector of the extracted test sequence is "I12." Then the concatenation creates the S/I object S12/I12.

This concatenation is then applied to the saved faulty primary output line 1-sets to determine the logic levels of a faulty primary output vector (lines 11-12). Thus if a faulty output line 1-set has a value of "1" for each of {S1/I10, S5/I12, S12/I11}, a logical intersection with the S/I object S12/I12 is the empty set, and the resulting logic level is "0." Whereas if the faulty output line 1-set is {S1/I10, S5/I12, S12/I12}, the intersection is {S12/I12} and the resulting logic level is "1." Recall that the definition of a valid test sequence is that when the sequence is applied to a good copy of the circuit and a bad copy of the circuit, the output levels differ between the two copies. Thus if the logic levels for the faulty primary output vector differ from the output levels for the extracted test sequence, the extracted test sequence is valid. If the logic levels for the two vectors are identical, the extracted test sequence is invalid (lines 13-16).

A SIMPLE EXAMPLE

The following example demonstrates the method for generating test patterns for sequential circuits according to the above-described principles of operation.

Figures 13, 14:
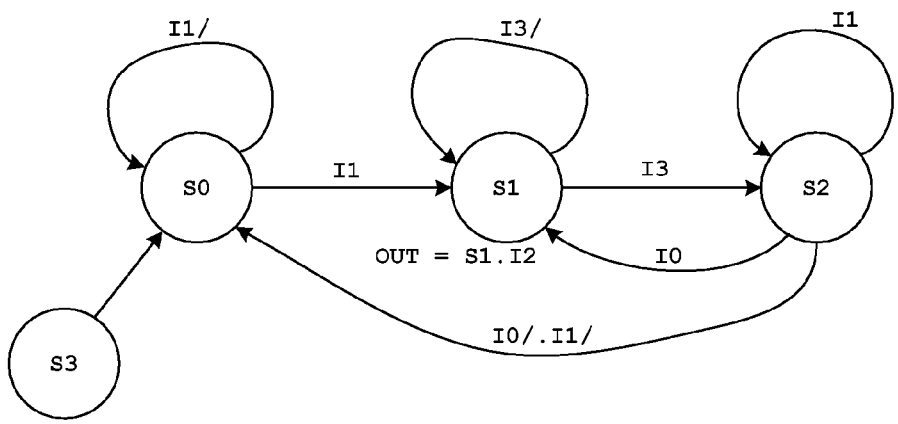
FIG. 13 is a list of logic equations defining the simple sequential circuit.
FIG. 14 is a state transition graph for the simple sequential circuit.
Figure 15:
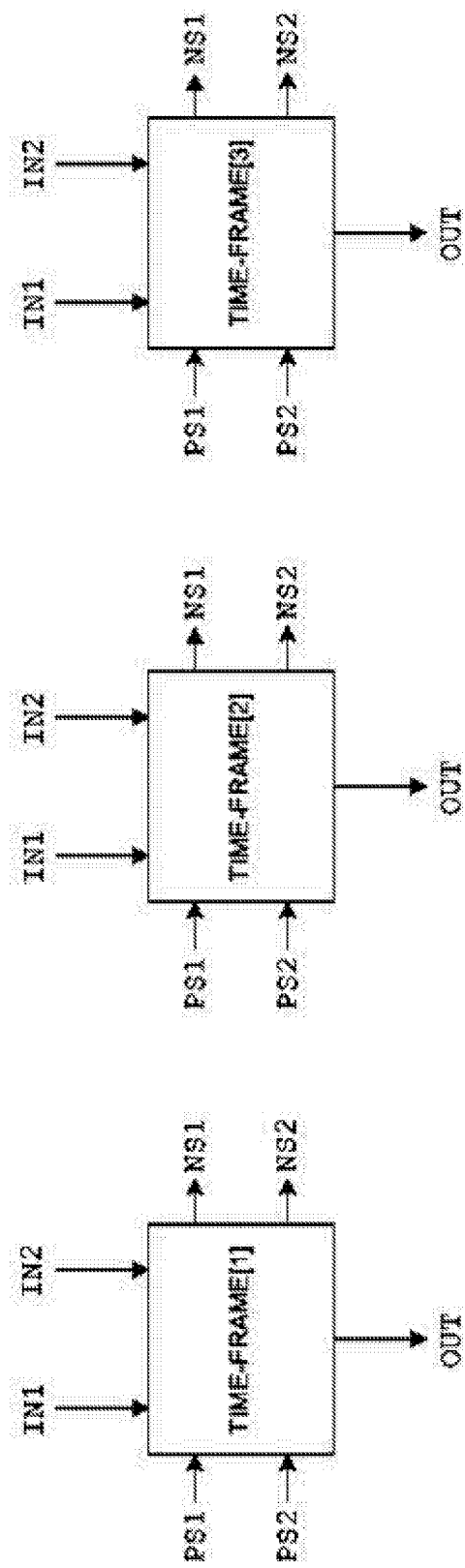
FIG. 15 is an iterative array of three time-frames for the simple sequential circuit.

The example uses a simple sequential circuit which has two primary input lines (IN1,IN2), two present-state lines (PS1,PS2), one primary output line (OUT), and two next-state lines (NS1,NS2). A block diagram for a combinational part of the simple circuit is shown in FIG. 12. The combinational part of the circuit is defined by logic equations shown in FIG. 13. It will be appreciated that the line NS1 is connected back to the line PS1 through a storage element, for example a delay flip-flop (not illustrated), and that the line NS2 is connected back to the line PS2 through a second delay flip-flop (also not illustrated). A circuit state transition graph is illustrated in FIG. 14. An iterative array of the combinational part of the circuit showing three time-frames is illustrated in FIG. 15. FIGS. 16-25 illustrate results at successive stages of the test pattern generation process.

With respect to the logic equations of FIG. 13, a logical AND is indicated by a decimal point placed between adjacent signal names. A logical inclusive OR is indicated by a plus sign placed between two signal names. A logical NOT is indicated by placing a forward slash immediately preceding a signal name. Consider the equation defining signal NS2: NS2=S0I1+S1NI3+S2I0. The signal line (net) named NS2 is driven by the output of a 3-input OR gate whose inputs are the signal lines named S0I1, S1NI3, and S2I0, respectively.

The logic equations of FIG. 13 define an incompletely specified finite state machine whose state transition graph is shown in FIG. 14. In a fault-free copy of the circuit, state S3 is not reachable except possibly during a power-ON sequence. State S3 always transitions to state S0. Primary input signal IN1 is the most significant bit of the (IN1, IN2) pair. Present-state signal PS1 is the most significant bit of the (PS1, PS2) pair. Next-state signal NS1 is the most significant bit of the (NS1, NS2) pair. Thus state S2, for example, is defined by the combination PS1=1 and PS2=0, while input vector I2 is defined by the combination IN1=1 and IN2=0.

The example will find test pattern sequences for two single stuck-at faults: the signal named S2I1 stuck-at 0 (hereafter fault S2I1/0), and the signal S1I3 stuck-at 0 (fault S1I3/0). Definitions of the two signals are shown in the logic equations of FIG. 13. Test sequences for both of these single stuck-at faults will be detected at the conclusion of a third time-frame in that each fault will reach the primary output line OUT during the third time-frame.

The first time-frame is purely combinational, and the teachings of U.S. Pat. No. 6,789,222 provide an explanation of the principles involved in a purely combinational time-frame. At the end of the first time-frame, the two faults S2I1/0 and S1I3/0 arrive at next-state lines as objects including fault-propagation functions. FIG. 16 is a table showing the faults at next-state lines NS1 and NS2 at the end of Time-Frame[1]. The fault S2I1/0 is present at next-state line NS1 as an object labeled 0 and having a fault-propagation function equal to S2.I1, which means that present-state S2 and primary input vector I1 cause the fault S2I1/0 to be activated and propagated to the next-state line NS1. The fault S1I3/0 is present at NS1 labeled 0 and having a fault-propagation function equal to S1.I3. Neither fault is present at line NS2.

An inter-time-frame process is performed on the two faults that have arrived at next-state lines at the end of Time-Frame[1]. FIG. 8 describes the steps to be taken during a fault-decomposition phase. No records exist at the end of Time-Frame[1], so records are created and are saved in a RECORD TABLE (referred to elsewhere as a "history" table). The resulting RECORD TABLE and its contents are shown in FIG. 17. A new label and the posted flag will be completed during a purge-posting phase.

The purpose of FIG. 15 is to reinforce the concept that fault objects arriving at the next-state lines at the end of one time-frame are transformed to new search objects and are then posted to the present-state lines of a next time-frame that correspond to the next-state lines at which they arrived. Thus for example, faults arriving at next-state line NS1 at the end of Time-Frame[1] will be transformed and the new objects will be placed onto present-state line PS1 before the start of Time-Frame[2], and likewise line NS2 to line PS2.

A purge-posting phase of the inter-time-frame process follows and is described in FIG. 9. Two records now exist in the RECORD TABLE having blank new-label fields. There are no other records having the same pattern and a non-blank new-label field. For this example labels are simply consecutive integers, so record #1 and record #2 will both get their new-label fields set to a next consecutive integer. After new search objects are created and placed on the present-state lines for Time-Frame[2], and after replacement local faults are created and saved, the posted flag for each record is set to TRUE. The resulting contents of the RECORD TABLE are shown in FIG. 18.

New search objects are created during the purge-posting phase of the inter-time-frame process. The objects are placed onto the present-state lines for Time-Frame[2]. Replacement local faults are created and are saved for use during Time-Frame[2]. The resulting new search objects and the corresponding replacement local faults are shown in FIG. 19.

The test generation process during Time-Frame[2] and subsequent time-frames differs from the process during Time-Frame[1]. During Time-Frame[2] and subsequent time-frames the replacement local fault constructed during the preceding inter-time-frame process is used in place of the combinational local fault. Path-enabling functions created and saved during Time-Frame[1] are reused during Time-Frame[2] and subsequent time-frames. FIG. 20 is a table showing the faults at next-state lines NS1 and NS2 at the end of Time-Frame[2]. Both faults have arrived at both next-state lines. Three of the fault-propagation functions contain more than one state/input vector combination. Typically, the data structure used for a fault-propagation function will be some form of Binary Decision Diagram so the individual S/I's that make up a fault-propagation function will not be apparent to a casual observer. The fault decomposition phase will decompose such Boolean functions into constituent S/I's. The actual S/I's are shown here in this example to keep it simple.

The RECORD TABLE is updated at the completion of Time-Frame[2] and the results are shown in FIG. 21. For this example records are numbered consecutively. The records created at the completion of Time-Frame[1] remain unchanged. New records corresponding to faults arriving at next-state lines at the end of Time-Frame[2] are used to create new records #3-#7.

FIG. 22 is a table showing new search objects created during the purge-posting phase of the preceding inter-time-frame process. Search objects are placed onto the present-state lines for Time-Frame[3] that correspond to the next-state lines at which each fault appeared of Time-Frame[2]. The label is used to distinguish search objects for a common fault. Thus the object labeled 1 for fault S2I1/0 has been mapped into new search objects labeled 2 and 3, while the object labeled 1 for fault S1I3/0 has been mapped into new search objects labeled 2, 3 and 4. These objects are created according to the rules set forth in FIG. 9.

FIG. 22 also shows replacement local faults created for use during Time-Frame[3]. A replacement local fault has the same fault-name, label, and good next-state as the new search object to which it corresponds. The I-part of each replacement local fault is the TF[1]I-part of the parent search object.

FIG. 23 is a table showing the results at the completion of Time-Frame[3]. Neither fault appears at a next-state line. Several search objects representing both faults appear at the primary output line, OUT. In this example two objects for each fault have arrived at OUT. Note that an object having label 2 for the fault S1I3/0 does not arrive at OUT nor at either next-state line.

The next steps of the process extract test pattern sequences for each fault object arriving at OUT. FIG. 24 is a table illustrating the extraction of test pattern sequences for the faults S2I1/0 and S1I3/0 following completion of Time-Frame[3]. Test pattern extraction uses the rules defined by FIG. 10. The test pattern sequences are presented reading left-to-right in this simple example.

FIG. 23 illustrates that the primary output line OUT presents a fault object <S2I1/0, 2, S1, I2> at the completion of Time-Frame[3]. The input vector I2 is extracted from that fault object (FIG. 24). The records in the RECORD TABLE for Time-Frame[2] are searched for records having fault-name S2I1/0 and new-label equal to 2. Record #3 is the only record meeting that criterion. The current-I for record #3, I0, is extracted and is concatenated to the front of the I2 from the object at OUT, forming an intermediate object <I0,I2>.

Next, the current-label for record #3, 1, is used to search the RECORD TABLE for Time-Frame[1] for records having fault-name S2I1/0 and new-label equal to 1. Record #1 meets the criterion. Since record #1 is found in the RECORD TABLE for Time-Frame[1], there are no earlier time-frames and the current-S and current-I for record #1 are extracted and concatenated to the front of the intermediate object to form a completed test sequence <S2, I1, I0, I2>.

To be useful for testing, a final good next-state and output level for the sequence must be determined. The state can be determined with reference to the fault object at OUT and the state transition graph of FIG. 14. The current-S and current-I for the object at OUT are <S1,I2>. Reference to FIG. 14 shows that at state S1, applying input vector I2 will result in a good next-state of S1. The logic level of the line OUT during S1.I2=1, as indicated by the logic equation for OUT (FIG. 13). Therefore, a complete test for the fault S1I2/0 is given by {S2I1/0: <S2, I1, I0, I2>, next-good-state =S1, current-output=1}. A copy of the circuit in which the signal S2I1 is stuck-at 0 will produce a current-output of 0 in response to the test sequence <S2, I1, I0, I2>.

As indicated by the table of FIG. 24, there are two test sequences for the fault S1I3/0. Label 3 produces the test {S1I3/0: <S1, I3, I1, I2 >, next-good-state=S0, current-output=0}. A faulty copy of the circuit will produce a current-output of 1 in response to this test. Label 4 produces the test {S1I3/0:<S1, I3, I0, I2>, next-good-state=S1, current-output=1}. A faulty copy of the circuit will produce a current-output of 0 in response to this test.

Finally, these test sequences must be validated. The output level for each test sequence when applied to a good copy of the circuit is shown in FIG. 24. It is necessary to determine an output level when each test sequence is applied to a faulty copy of the circuit and to observe that the faulty output level is different from the good output level. When there is a single primary output line, as is the case for the circuit of FIG. 12, the faulty and the good output levels for a valid test sequence are logical inverses of one another. When there are multiple primary output lines (not illustrated), and the lines are considered as a group as an output vector, then the faulty and good output vectors for a valid test sequence must differ in at least one primary output line. In other words, the vectors must differ.

FIG. 25 is a table illustrating the validation of extracted test pattern sequences. As shown in FIG. 24, the two faults S2I1/0 and S1I3/0 have two extracted test sequences each. FIG. 11 illustrates a process for validating extracted test pattern sequences.

The faulty 1-sets for the fault S2I1/0 are created by forcing S2I1-1 to be "0" and then continuing 1-set creation from that point. The resulting next-state line and output line faulty 1-sets are shown in FIG. 25. NS1-1 will have a value of "1" for the S/I combination S1.I3, and will have a value of "0" for all other S/I combinations. NS2-1 will have a value of "1" for the S/I combinations S0.I1, S1.I0, S1.I1, S1.I2, and S2.I0, and will have a value of "0" for all other S/I combinations. OUT-1 will have a value of "1" for the S/I combination S1.I2 only.

When the extracted test sequence #1 is applied to a good copy of the circuit, the resulting logic level for the primary output line OUT is a "1." When sequence #1 is applied to a faulty copy of the circuit (as represented by the faulty 1-sets for the fault S2I1/0) the faulty state sequence differs from the good state sequence, and the resulting logic level for the primary output line OUT is a "0." The #1 extracted test sequence is able to distinguish a good copy of the circuit from a copy that includes an S2I1/0 fault and is therefore a valid test sequence.

The same procedure is followed for extracted test sequence #2 for the fault S2I1/0, and that test sequence is also shown to be valid.

Next, the fault S1I3/0 is considered and its faulty next-state line and output line 1-sets are created. Faulty state sequences are created for the #1 and #2 extracted test sequences for fault S1I3/0 and the resulting outputs are compared with good state sequence outputs. Both of the extracted test sequences are shown to be valid.

This simple example did not provide an instance of an extracted test sequence being invalidated. Many, if not most, extracted test sequences are valid, but invalid test sequences do occur, thus making a validation process necessary.

Final Word About Completeness

Unlike the methods taught by U.S. Pat. No. 6,789,222 for combinational circuits, the methods taught by the present invention are not complete. That means that the methods do not find all test sequences for each detectable fault. This is true for several reasons. For example, the method finds shorter test sequences before finding longer sequences because the number of time-frames is increased until a valid test sequence is found and then the fault is dropped. For many faults (fault classes), the shorter test sequences are members of an infinite set of test sequences for which the additional tests grow progressively longer by containing state loops that repeat parts of a test sequence without bringing it to a conclusion. Experiment has shown that depending upon how the initial activating S/I's are decomposed, some short tests are not found, though longer tests are found. Experiment has also shown that a faulty next-state mapping sometimes finds valid, short test sequences that are not found by good next-state mapping.

Nonetheless, good next-state mapping is preferred because the path-enabling functions can be created during a first combinational time-frame and then used for all faults and all subsequent time-frames. Faulty next-state mapping, on the other hand, requires that unique faulty path-enabling functions be created for each fault, thus increasing both the amount of work and the amount of storage required.

While the invention has been described in relation to the embodiments shown in the accompanying Drawing figures, other embodiments, alternatives and modifications will be apparent to those skilled in the art. It is intended that the Specification be exemplary only, and the true scope and spirit of the invention be indicated by the following Claims.

What is claimed is:

1. A single-pass method for generating test patterns for sequential circuits wherein fault objects arriving at circuit next-state lines are mapped into good next-state fault objects, permitting a fault-propagation function size and a path-enabling function size to be bounded by a function size established during an initial time-frame, and wherein (a) a search for test patterns continues from one time-frame to a next until a valid test pattern is found for each detectable fault, or alternatively, (b) until otherwise halted.

2. The method of claim 1 wherein path-enabling functions created during an initial time-frame are saved and are reused during subsequent time-frames.

3. A single-pass method for generating test patterns for a sequential circuit, comprising the steps of:

(a) receiving a netlist defining a sequential circuit, the circuit including primary input lines, present-state lines, primary output lines, and next-state lines;

(b) sorting the netlist into an ascending circuit level order;

(c) performing combinational test pattern generation on the sorted netlist in an attempt to activate and propagate single stuck-at faults to primary output lines and next-state lines, the faults being represented by fault-propagation functions;

(d) decomposing fault-propagation functions reaching next-state lines;

(e) mapping the decomposed functions to good next-state search objects;

(f) creating a replacement local fault for each good next-state search object;

(g) constructing a history of mapped functions, search objects, and of fault-propagation functions reaching primary output lines;

(h) posting the good next-state search objects to the present-state lines which correspond to the next-state lines reached by the fault-propagation functions and good next-state search objects;

(i) performing a modified combinational test pattern generation on the sorted netlist using the replacement local faults in an attempt to propagate good next-state search objects to primary output lines and next-state lines, the search objects being represented by fault-propagation functions;

(j) extracting test patterns from the constructed history for circuit single stuck-at faults that reached circuit primary output lines;

(k) validating the extracted test patterns, and discarding invalid test patterns;

(l) continuing from the decomposing step until every detectable single stuck-at fault has a valid test pattern; and then (m) providing the valid test patterns.

4. The method of claim 3 further including the steps of
(a) defining a subset of all single stuck-at faults of the sequential circuit, and
(b) limiting the attempt to activate and propagate single stuck-at faults to those faults within the defined subset.

5. The method of claim 3 further including the steps of
(a) saving path-enabling functions created during the performing combinational test pattern generation step, and
(b) reusing the saved path-enabling functions for all subsequent steps.

6. The method of claim 3 wherein the decomposing step includes decomposing each fault-propagation function reaching a next-state line into distinct present-state/input-vector combinations.

7. The method of claim 6 wherein the mapping step includes mapping each distinct present-state/input vector combination to a good next-state.

8. The method of claim 7 further including the step of associating each distinct present-state/input vector combination with
(a) its mapped good next-state,
(b) an identification of which next-state lines the fault-propagation function that decomposed into the distinct present-state/input vector combination arrived at, and
(c) the specific fault activating input vector combination that is the earliest ancestor of the distinct present-state/input vector combination,
the association of these elements defining a current pattern.

9. The method of claim 8 further including the step of
(a) determining whether the current pattern has previously occurred, and if so, continuing with a step for
(b) eliminating the association defining the current pattern.

10. The method of claim 9 wherein the posting step further includes a step of flagging an association that has resulted in the posting of a new search object.

11. The method of claim 10 wherein the creating replacement faults step creates a replacement local fault having a good next-state part and a fault activating input vector part that is an earliest ancestor included in the association that has resulted in the posting of a new search object.

12. The method of claim 11 wherein the constructing a history step further includes the step of
maintaining a collection of non-eliminated associations, and their new search objects,
permitting purging of unproductive searches and extraction of test patterns.

13. The method of claim 11 wherein the performing a modified combinational test pattern generation step uses a replacement local fault that is a function of a good next-state and the fault activating input vector that appears in the association.

14. The method of claim 3 wherein the extracting test patterns step uses fault-propagation functions that reach primary output lines and the constructed history.

15. The method of claim 3 wherein
(a) the constructed history includes a history of fault-propagation functions that have reached primary output lines, and
(b) the extracting test patterns step extracts test patterns from the constructed history.

16. A computer program product, comprising:
(a) a computer readable medium; and
(b) means provided on the medium for directing a computer system to perform the following steps defining a single-pass method for generating test patterns for a sequential circuit:
(1) receiving a netlist and a library of logic elements defining the sequential circuit;
(2) sorting the netlist into an ascending circuit-level order;
(3) initializing storage locations corresponding to primary input lines and present-state lines for a first time-frame of an iterative array representation of the sequential circuit;
(4) performing combinational test pattern generation for the first time-frame using the sorted netlist, the library of logic elements, and the initialized storage locations;
(5) performing an inter-time-frame process using transformed results of the test pattern generation to initialize storage locations corresponding to primary input lines and present-state lines for a next time-frame, creating replacement local faults, and creating and updating table entries storing a history of the inter-time-frame process;
(6) performing a modified combinational test pattern generation for the next time-frame using the replacement local faults, the sorted netlist, the library of logic elements, and the initialized storage locations;
(7) extracting test patterns from the stored process history;
(8) validating extracted test patterns;
(9) determining whether additional time-frames are needed, and if so, continuing with step (b) (5); else
(10) providing validated test patterns.

17. The computer program product of claim 16, further including steps for
(a) defining a subset of all circuit single stuck-at faults, and for
(b) limiting the process to the members of the defined subset.

18. The computer program product of claim 16, further including
(a) saving path-enabling functions created during step (b) (4), and
(b) reusing the saved path-enabling functions during subsequent steps.

19. The computer program product of claim 16, further including the steps of
(a) determining a highest circuit level at which a signal is used, and (b) releasing for reuse no-longer-needed storage reserved for the signal after processing is completed at the signal's highest level use.

20. The computer program product of claim 16, wherein step (b) (5) includes (a) a fault-decomposition phase and
(b) a purge-posting phase.

21. A single-pass test pattern generation method for sequential circuits, comprising the steps of:

(a) receiving a description of a sequential circuit;
(b) deriving a netlist from the description;
(c) sorting the netlist into a circuit level order;
(d) creating a list of all single stuck-at faults of the circuit, defining a fault-list;
(e) initializing circuit primary input lines and circuit present-state lines;
(f) performing a combinational test pattern generation on the sorted netlist using the initialized lines;
(g) constructing test patterns for faults reaching circuit primary output lines;
(b) dropping faults having constructed test patterns from is the fault-list;
(i) determining whether all faults of the fault-list have been dropped, and if "ayes," then providing the constructed test patterns and halting; else, continuing from step (j);
(j) performing an inter-time-frame process on faults reaching circuit next-state lines;
(k) constructin history records for faults reaching circuit next-state lines and circuit primary output lines;
(l) performing a modified combinational test pattern generation on the sorted netlist using the results of the inter-time-frame process;
(m) constructing test patterns for faults reaching circuit primary output lines;
(n) validating the constructed test patterns of step (m);
(o) dropping faults having valid constructed test patterns from the fault-list; and then
(p) continuing from step (i).

\* \* \* \* \*